(12) United States Patent
Song et al.

(10) Patent No.: US 6,458,494 B2
(45) Date of Patent: *Oct. 1, 2002

(54) ETCHING METHOD

(75) Inventors: Ki Chang Song; Jong Uk Bu, both of Kyonggi-do; Chil Keun Park, Seoul, all of (KR)

(73) Assignee: LG Electronics, Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/559,079

(22) Filed: Apr. 27, 2000

(30) Foreign Application Priority Data

Apr. 29, 1999 (KR) .......................................... 99-15492

(51) Int. Cl.⁷ ........................... H01L 21/302; G03F 9/00
(52) U.S. Cl. ........................... 430/5; 438/750; 438/753; 438/734; 438/694; 438/725; 438/719; 216/41; 216/79; 216/99; 216/5; 216/23; 216/24
(58) Field of Search ................................ 430/5; 216/41, 216/79, 99, 5, 23, 24; 438/750, 753, 734, 694, 725, 719

(56) References Cited

U.S. PATENT DOCUMENTS 4,139,442 A * 2/1979 Bondur et al. .......... 204/192 E
4,911,783 A * 3/1990 Voboril ........................ 156/643
5,738,757 A * 4/1998 Burns et al. .............. 156/644.1
5,958,800 A * 9/1999 Yu et al. ...................... 438/720

FOREIGN PATENT DOCUMENTS

| DE | 2535156 | * | 2/1977 |
| EP | 1049143 A3 | * | 11/2000 |
| JP | 04-003458 | * | 1/1992 |
| JP | 07-066276 | * | 3/1995 |
| JP | 08-273990 | * | 10/1996 |
| JP | 08-279488 | * | 10/1996 |
| JP | 11-045874 | * | 2/1999 |

OTHER PUBLICATIONS

"ICP Etching of SiC", Solid State Electronics; vol. 42, No. 12; Wang et, al.; pp. 2283–2287.*

* cited by examiner

Primary Examiner—George Goudreau
(74) Attorney, Agent, or Firm—Morgan, Lewis & Bockius LLP

(57) ABSTRACT

Etching method applicable to a semiconductor device fabrication and an MEMS(Micro-Electro-Mechanical System) process, including the steps of forming an etching mask on a substrate, forming a plurality of patterns in the etching mask corresponding to depths of the plurality of trenches; and etching the substrate using the etching mask having the plurality of patterns formed therein, whereby eliminating an alignment error in respective photolithography, that permits to form a precise structure, simplify a fabrication process, and reduce a production cost.

6 Claims, 15 Drawing Sheets

ETCHING METHOD

BACKGROUND OF THE INVENTION

1. Field of the Invention

The present invention relates to an etching method, and more particularly, to an etching method applicable to a semiconductor device fabrication and an MEMS(Micro-Electro-Mechanical System) process.

2. Background of the Related Art

In general, the etching is an essential process in fabrication of a semiconductor device as well as in fabrication of the MEMS currently under research widely, which occupy great portions of the fabrication processes. In the etching, an etching mask is always required for separate a portion to be etched from a portion to be protected from the etching. As the etching mask, a photoresist thin film, a nitride thin film, such as SiN, an oxide thin film, such as SiO2, and a metal thin film, such as Cr, can be used, selectively.

As one example, a related art wet etching will be explained. Referring to FIG. 1, in fabrication of a device having different etching depths 'A', 'B', and 'C', the following two methods are used in the related art.

Referring to FIG. 2A, in the first method, a first SiN etching mask layer 2 and the first photoresist layer 3 are formed in succession on the silicon substrate 1, and a portion of the first SiN etching mask layer 2 is removed by photolithography and etching, to expose a region of the silicon substrate 1. Then, as shown in FIG. 2B, the first SiN etching mask layer 2 is used as a mask in etching the silicon substrate 1 to an 'A' depth in FIG. 1, and the first SiN etching mask layer 2 and the first photoresist layer 3 are removed. Then, as shown in FIG. 2C, a second SiN etching mask layer 4 and a second photoresist layer 5 are formed in succession on an entire surface of the substrate 1, and a portion of the second SiN etching mask layer is removed by photolithography and etching, to expose a region of the silicon substrate 1. Then, as shown in FIG. 2D, the second SiN etching mask layer 4 is used as a mask in etching the silicon substrate 1 to a depth of 'B' in FIG. 1, and the second SiN etching mask layer 4 and the second photoresist layer 5 are removed. And, as shown in FIGS. 2E and 2F, a third SiN etching mask layer 6 and a third photoresist layer 7 are used in etching to 'C' depth in FIG. 1 in the same method as the above methods, to complete fabrication of a device having different etching depths of 'A', 'B', and 'C' as shown in FIG. 2G.

Referring to FIG. 3, in the second method, a first SiN etching mask layer 12 and a first photoresist layer 13 are formed on a silicon substrate 11, and portions of the first SiN etching mask layer 12 are removed by photolithography and etching, to expose regions of the silicon substrate 1 to be etched as 'A', 'B' and 'C' in FIG. 1. Then, as shown in FIG. 3B, the first SiN etching mask layer 12 is used as a mask in etching the exposed silicon substrate 11 in overall for the first time to a depth 'C' in FIG. 1 which has the shallowest etching depth, and the first SiN etching mask layer 12 and the first photoresist layer 13 are removed. And, as shown in FIG. 3C, a second SiN etching mask layer 14 and a second photoresist layer 15 are formed in succession on an entire surface of the substrate 11, and a portion of the second SiN mask layer 14 is removed by photolithography, to expose the silicon substrate 11 only in the 'B' region of FIG. 1. Then, as shown in FIG. 3D, the second SiN etching mask layer 14 is used as a mask in etching the silicon substrate 11 etched for the first time for the second time, and the second SiN etching mask layer 14 and the second photoresist layer 15 are removed. And, as shown in FIGS. 3E and 3F, a third SiN mask layer 16 and a third photoresist layer 17 are used in etching 'A' region in FIG. 1 etched for the first time for the second time by a method the same as the foregoing method, to complete fabrication of a device having different etching depths of 'A', 'B' and 'C' as shown in FIG. 3G.

However, the related art methods are complicated since photolithography and etching mask removal are required every time 'A', 'B' and 'C' regions are etched. And, an etching mask used in a prior etching should be removed before a following etching process is started, and if the etching mask is not removed perfectly, formation of an etching mask for the following etching can not be done properly. That is, in the removal of the etching mask used in the prior etching, if the etching mask is not removed properly after the prior etching process is finished, there are over-hangs of the etching mask left at edges of the etched regions as shown in FIG. 4, which causes a shadow effect in formation of an etching mask for the following etching, to impede formation of an etching mask thin film at the edges of the etched regions. And, as shown in FIG. 5B, in the photolithography, misalignment of a mask pattern is occurred, which impedes fabrication of a precise device, particularly, as shown in FIG. 5A, in an MEMS fabrication, in order to enhance a device precision, an improvement of an etching process that can reduce an alignment error of the mask pattern is required.

SUMMARY OF THE INVENTION

Accordingly, the present invention is directed to an etching method that substantially obviates one or more of the problems due to limitations and disadvantages of the related art.

An object of the present invention is to provide an etching method which can reduce a misalignment error of a mask pattern in etching.

Other object of the present invention is to provide a simple etching method which permits to etch to a variety of depths by using only one etching mask.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the etching method for forming a plurality of trenches or recesses having depths different from one another in a substrate, includes the steps of forming an etching mask on the substrate, forming a plurality of patterns in the etching mask corresponding to depths of the plurality of trenches, and etching the substrate using the etching mask having the plurality of patterns formed therein.

In other aspect of the present invention, there is provided an etching method, including the steps of forming an etching mask on a substrate, etching a first, a second, and a third regions in the etching mask to a first depth on the same time, forming a first mask pattern in the first region, and using the first mask pattern as a mask in etching the second and third regions of the etching mask on the same time to a second depth, removing the first mask pattern, and forming second mask patterns in the first and second regions, etching the third region of the etching mask using the second mask patterns as a mask, to expose the substrate, removing the second mask patterns, and using the etching mask as a mask in etching the exposed substrate to a third depth, etching the second region of the etching mask to expose the substrate, and etching the exposed substrate to a fourth depth using the etching mask, and etching the first region of the etching mask to expose the substrate, and using the etching mask as a mask in etching the exposed substrate to a fifth depth.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
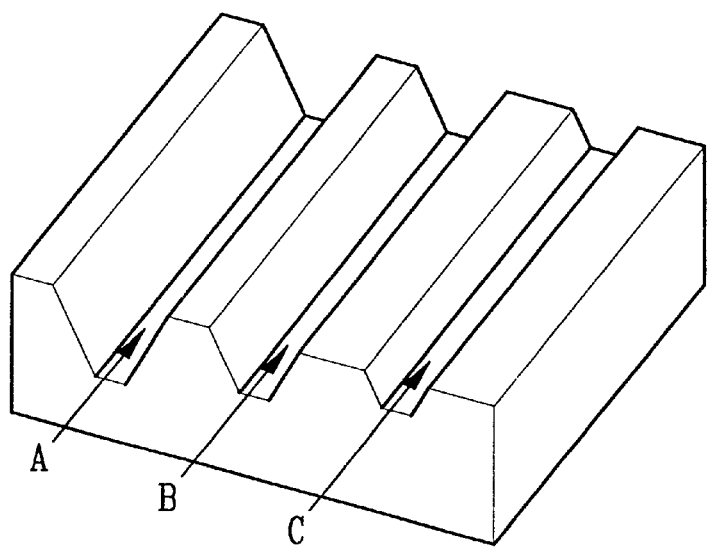
FIG. 1 illustrates a silicon structure formed by a related art etching method.
Figure 2A:
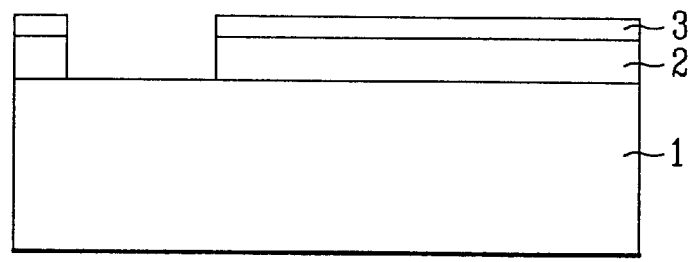
FIGS. 2A~2G illustrate a first related art example of an etching process for fabricating the silicon structure in FIG. 1.
Figure 2B:
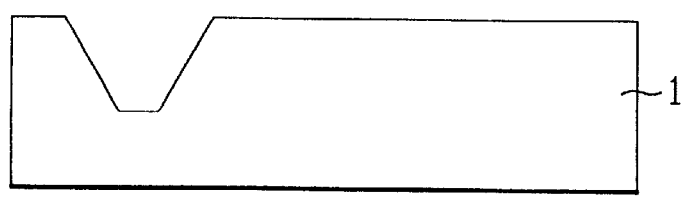
Figure 2C:
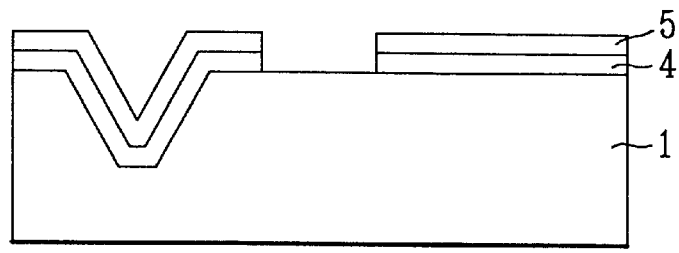
Figure 2D:
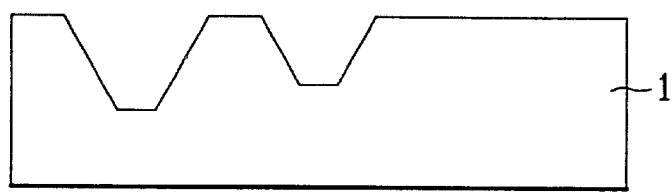
Figure 2E:
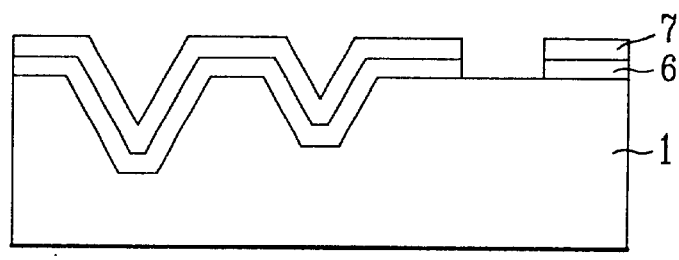
Figure 2F:
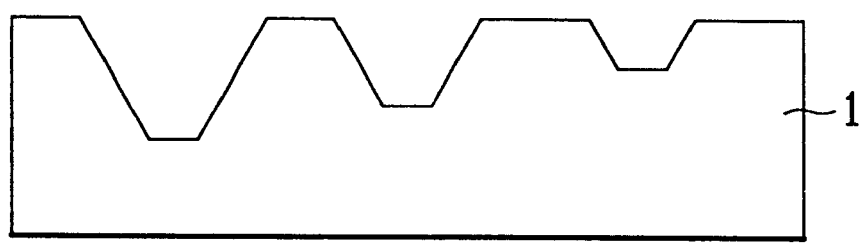
Figure 2G:
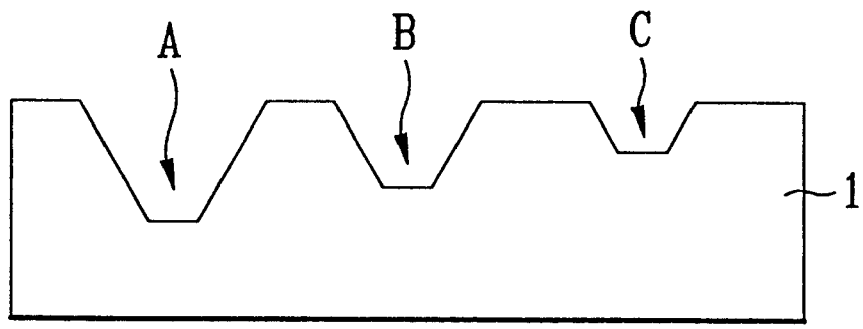
Figure 3A:
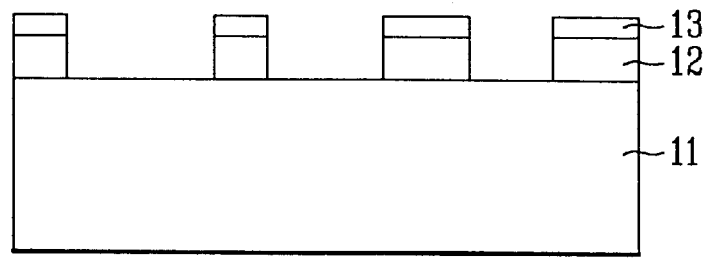
FIGS. 3A~3G illustrate a second related art example of an etching process for fabricating the silicon structure in FIG. 1.
Figure 3B:
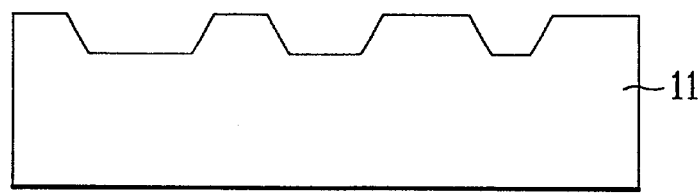
Figure 3C:
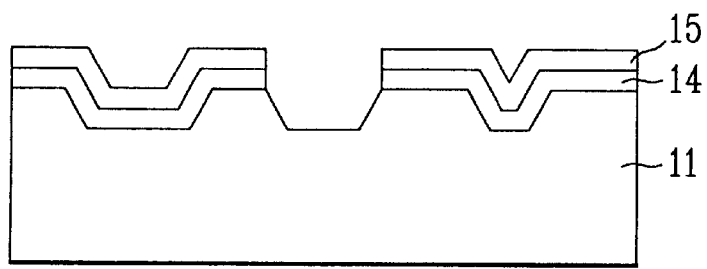
Figure 3D:
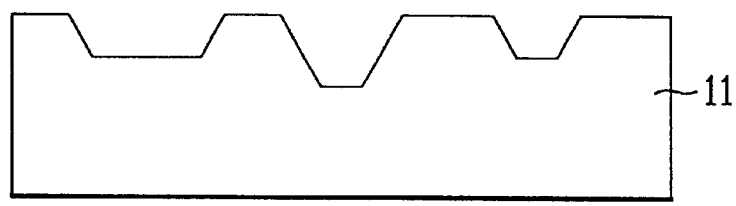
Figure 3E:
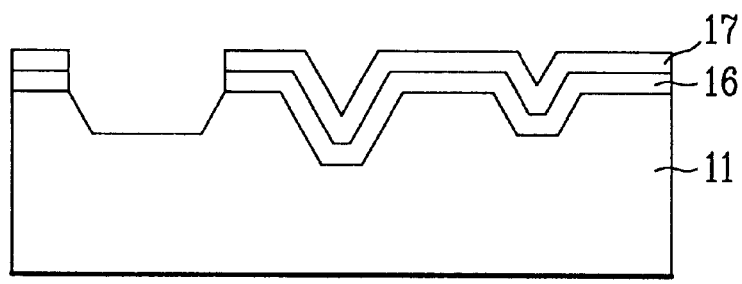
Figure 3F:
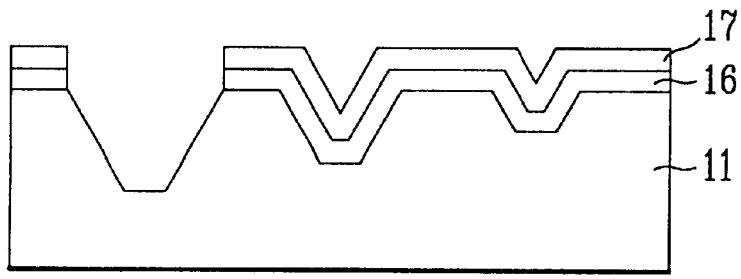
Figure 3G:
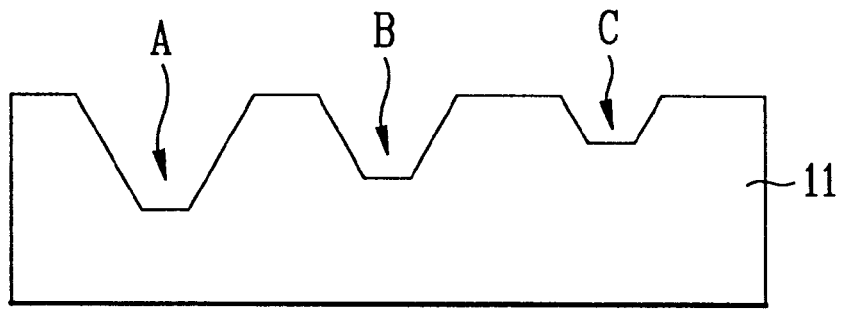
Figure 4:
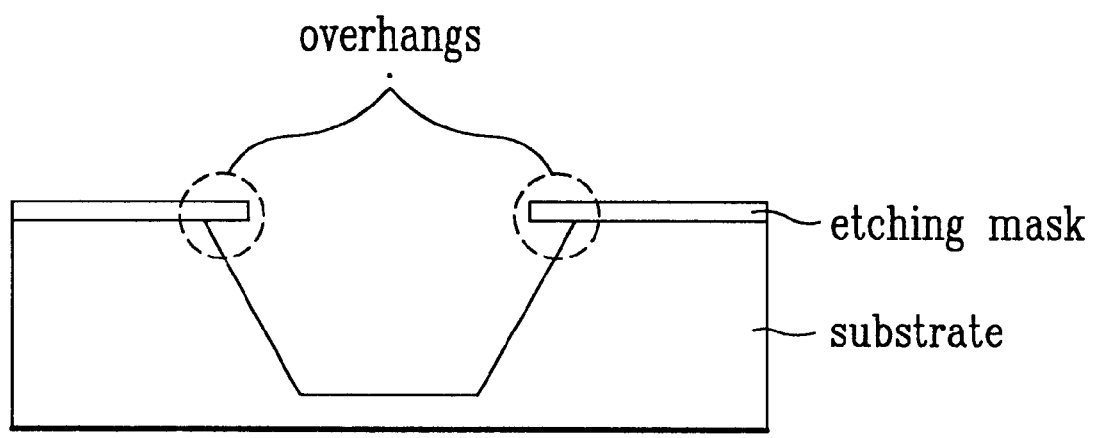
FIG. 4 illustrates overhangs of an etching mask occurred by the related art etching method.
Figure 5A:
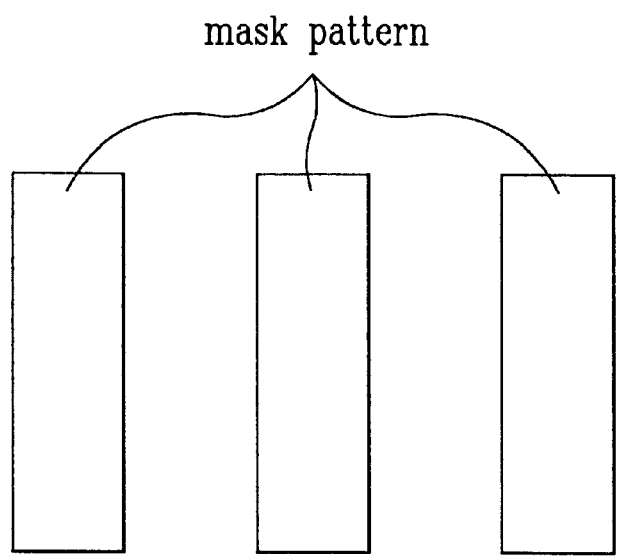
FIGS. 5A and 5B illustrate an aligned mask pattern and non-aligned mask pattern, respectively.
Figure 5B:
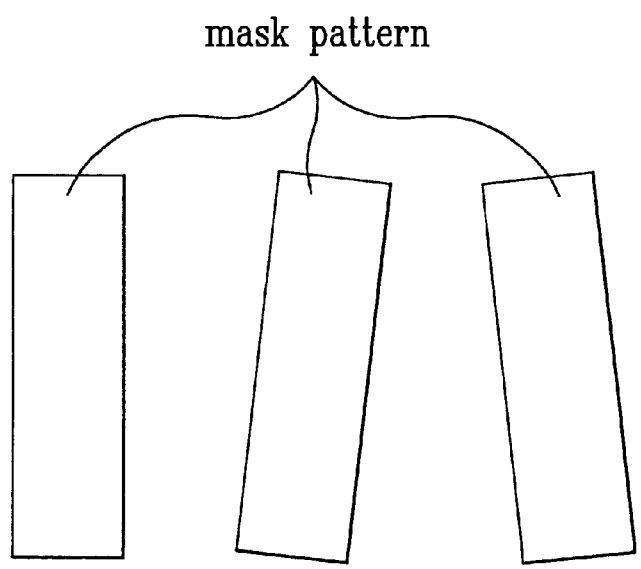
Figure 6:
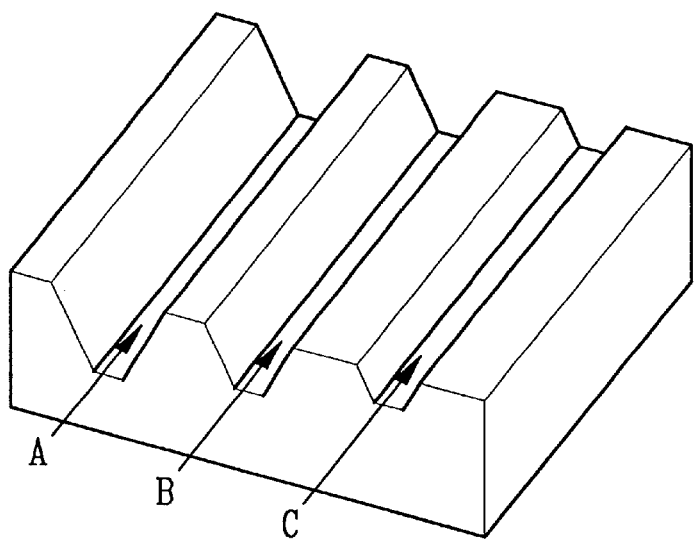
FIG. 6 illustrates a silicon structure formed by a wet etching method in accordance with a preferred embodiment of the present invention.

Reference will now be made in detail to the preferred embodiments of the present invention, examples of which are illustrated in the accompanying drawings. The present invention provides an etching method, in which an etching mask formed for the first time is used in the next etching as it is. That is, as shown in FIG. 6, in fabrication of a device having different etch depths 'A', 'B' and 'C', the present invention provides an etching method which permits a simple and precise etching by using, not many etching masks as the case of the related art, but only one etching mask, applicable both to an wet etching and dry etching, and all kinds of wafers, etching solutions, and etching gases. For example, in a case when a silicon structure is wet etched, an isotropic or an anisotropic etching of a silicon single crystal is possible depending on selected etching solution, which can be selected according to an etching purpose. HNA(HF+HNO$_3$+Acetic Acid) is used as an isotropic etching solution, and EDP(Ethylenediamine Pyrocatechol Water), TMAH (Tetramethyl Ammonium Hydroxide), or KOH(Potassium Hydroxide) is used as an anisotropic etching solution.

In general, as silicon single crystal used in fabrication of MEMS, a wafer with an (100) plane and an (110) plane is used. In the present invention, an etching method of wet etching a (100) silicon wafer by using KOH solution will be explained as one embodiment.

Figure 7A:
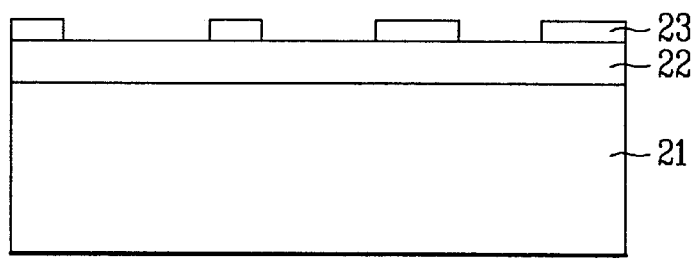
FIGS. 7A~7K illustrate sections showing the steps of an etching method for fabricating the structure in FIG. 6 in accordance with a preferred embodiment of the present invention.
Figure 7B:
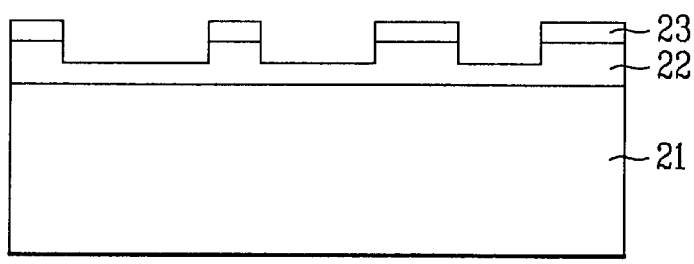
Figure 7C:
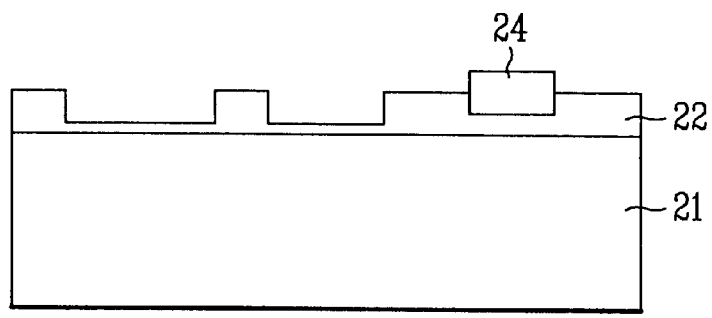
Figure 7D:
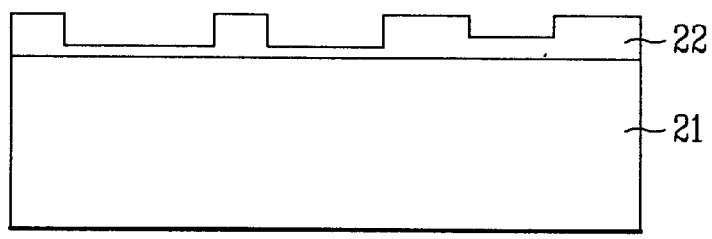
Figure 7E:
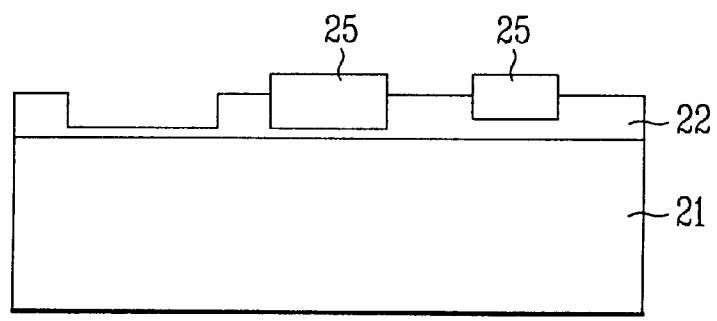
Figure 7F:
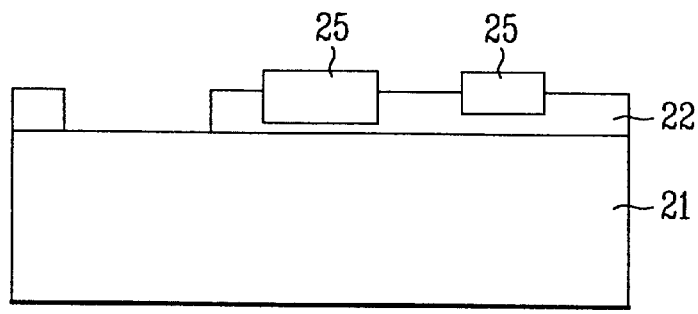
Figure 7G:
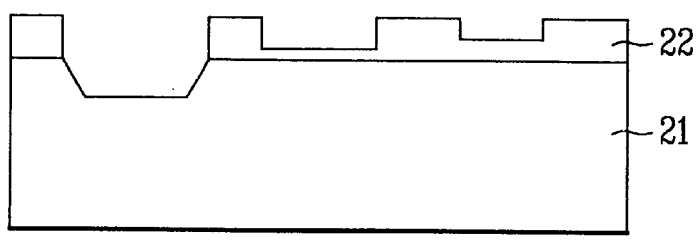
Figure 7H:
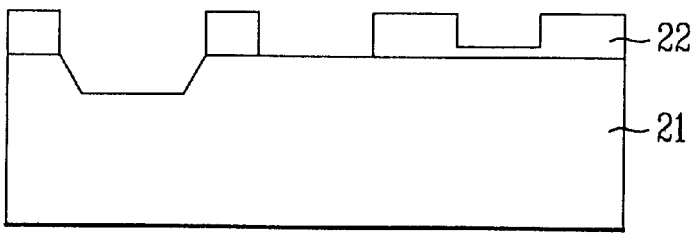
Figure 7I:
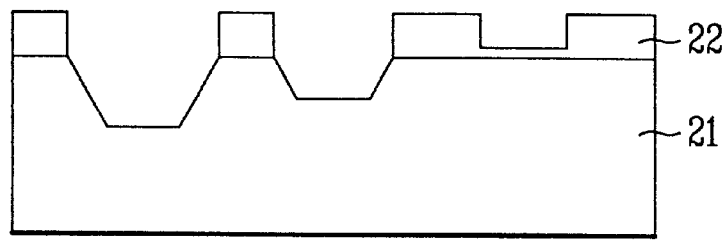
Figure 7J:
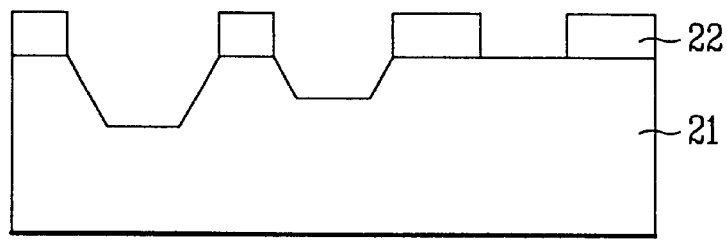
Figure 7K:
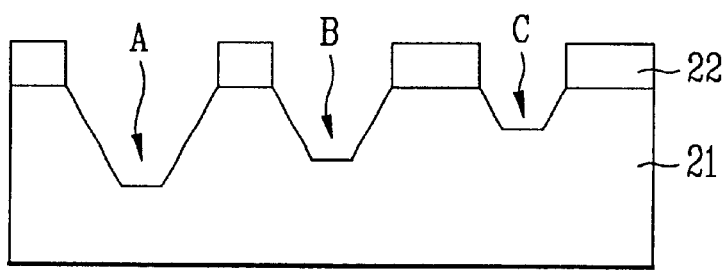

Referring to FIG. 7A, an SiN etching mask layer 22 is formed on a silicon substrate 21, and a plurality of photoresist patterns 23 are formed on the SiN etching mask layer 22. Then, as shown in FIG. 7B, the first photoresist patterns 23 are used as masks in removing the SiN etching mask layer 22 to a required depth by dry etching. The depth is determined taking a depth in the silicon substrate 21 to be etched in a later step. As shown in FIG. 7C, the first photoresist pattern 23 is removed, a second photoresist pattern is formed in a region to be etched the shallowest the same as the 'C' region in FIG. 6, and the second photoresist pattern 24 is used as a mask in etching the SiN etching mask layer 22 to a required depth. Then, as shown in FIG. 7D, the second photoresist pattern 24 is removed, a third photoresist pattern 25 is respectively formed in the 'B' region and the 'C' region in FIG. 6 as shown in FIG. 7E, and the third photoresist patterns 25 are used as masks in dry etching as shown in FIG. 7F, to remove the SiN etching mask layer 22 only from 'A' region in FIG. 6, to expose the substrate 21. And, as shown in FIG. 7G, the third photoresist pattern 25 is removed, and the SiN etching mask layer 22 is used as a mask in wet etching the exposed substrate 21 to a depth. Then, as shown in FIG. 7H, upon etching the substrate 21 on the whole without photolithography process, the SiN etching mask layer 22 is removed from the 'B' region in FIG. 6, to expose the substrate 21. As shown in FIG. 7I, identical to the above step, the SiN etching mask layer 22 is used as a mask in wet etching the exposed substrate 21 to a depth, and the substrate 21 is dry etched on the whole without a photolithography process as shown in FIG. 7J, to remove the SiN etching mask layer 22 from the 'C' region in FIG. 6, to expose the substrate 21. Then, as shown in FIG. 7K, the SiN etching mask layer 22 is used as a mask again in wet etching the exposed substrate 21 to a depth, to obtain a silicon structure as shown in FIG. 6. In the wet etching, 30 wt % KOH water solution is used at a temperature of approx. 80° C.

Though the alignment error in the related art etching method caused by a requirement for formation of the etching mask layer and conduction of photolithography without fail every time before the 'A', 'B', and 'C' portions are respectively wet etched has impeded fabrication of a precise device, since a precision of the photolithography is of no great significance for the present invention, fabrication of a precise device is possible in the present invention. Because an outline of a photoresist pattern is defined in the first dry etching, what is required for the following dry etching is only reduction of a thickness of the etching mask layer. And, the use of only one etching mask layer required in the present invention can simplify the fabrication process compared to the related art.

Figure 8:
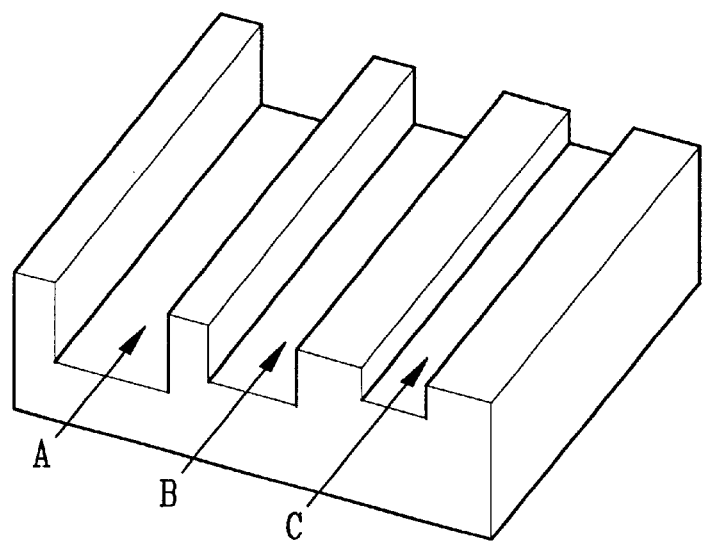
FIG. 8 illustrates a perspective view of a silicon structure formed by a dry etching method in accordance with a preferred embodiment of the present invention.
Figure 9A:
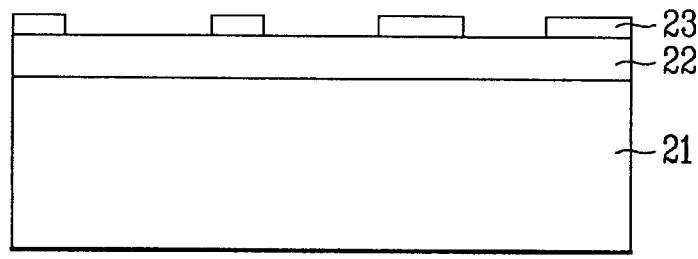
FIGS. 9A~9K illustrate sections showing the steps of an etching method for fabricating the structure in FIG. 8 in accordance with a preferred embodiment of the present invention.
Figure 9B:
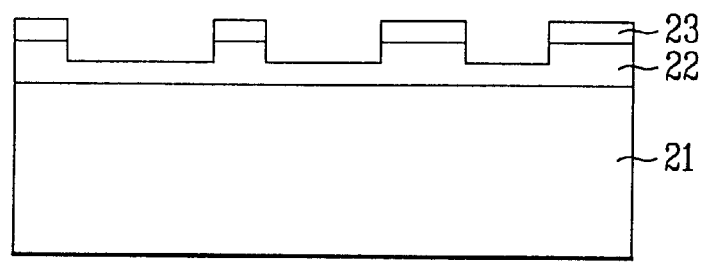
Figure 9C:
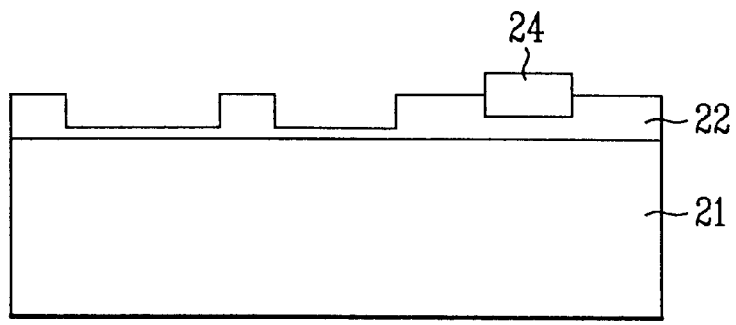
Figure 9D:
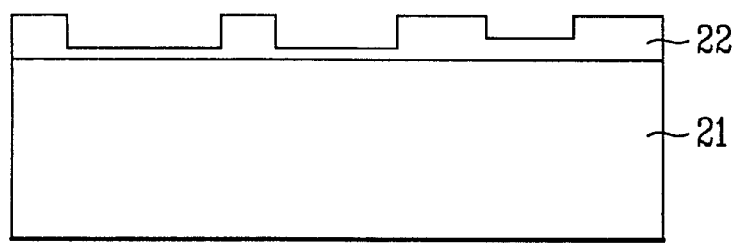
Figure 9E:
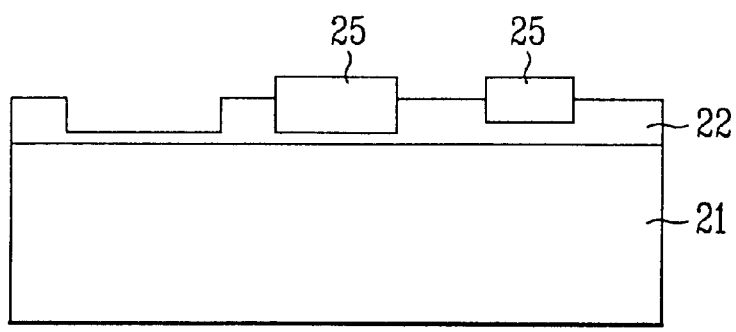
Figure 9F:
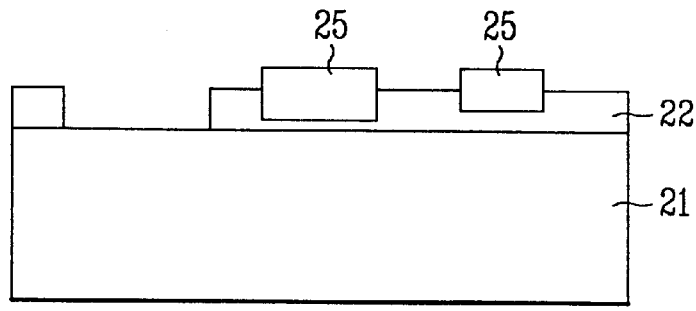
Figure 9G:
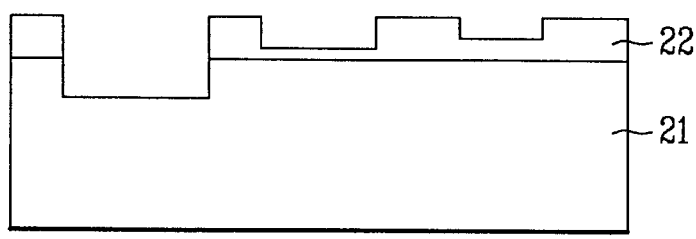
Figure 9H:
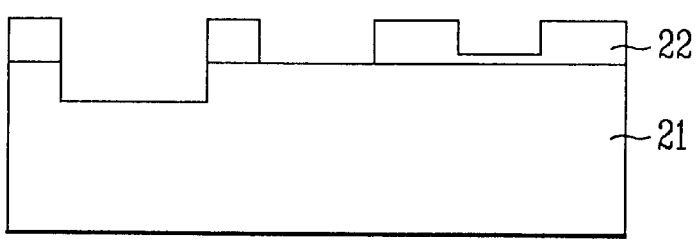
Figure 9I:
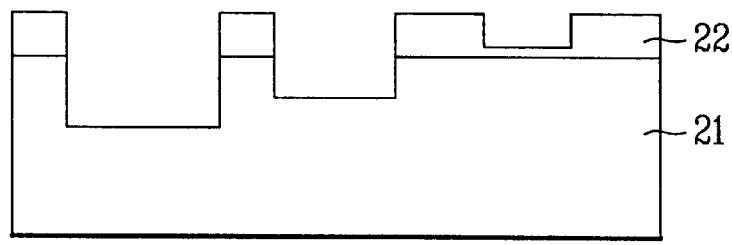
Figure 9J:
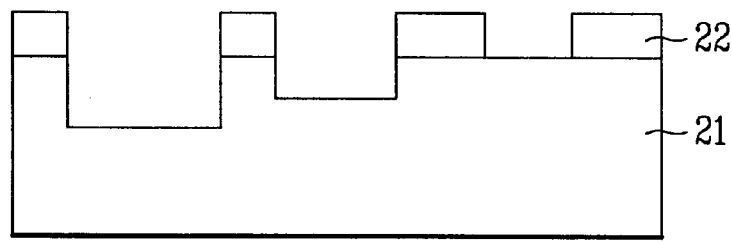
Figure 9K:
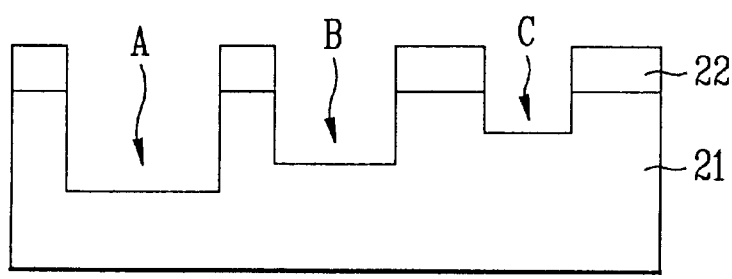

In the anisotropic wet etching of silicon, a surface of an (100) wafer is an (100) plane, and a side surface of the (100) wafer is an (111) plane, wherein the (111) plane is tilted by approx. 54.7° from the (100) plane. However, in MEMS fabrication process, there are many cases when a side surface at a right angle from the (100) plane wafer surface is required. In these cases, though a dry etching can make such a vertical side surface available, it is very difficult to conduct the dry etching by only using a photoresist pattern the same as the related art for obtaining the structure in FIG. 8. Accordingly, a dry etching by a method as shown in FIGS. 7A–7B can make the structure as shown in FIG. 8 available with easy.

FIGS. 9A–9K illustrate sections showing the steps of a process for dry etching a silicon substrate, which are identical to FIGS. 7A 7K, detailed explanations of which will be omitted. The etching mask layer 22 is formed of ITO(Indium Tin Oxide), and removed by using $Cl_2+BCl_3$ gases. The silicon substrate 21 is etched using $SF_6$ gas and utilizing a high etching selectivity of the silicon substrate 21 over the etching mask layer 22.

Thus, in a wet etching, the present invention permits to form an SiN thin film as an etching mask only once for conducting etching over three times in formation of a silicon structure having three different depths, which is applicable to a dry etching, the present invention has a wide application.

The elimination of an alignment error from respective photolithography by the present invention permits fabrication of a precise structure, to simplify a fabrication process, and to reduce a production cost.

It will be apparent to those skilled in the art that various modifications and variations can be made in the etching method of the present invention without departing from the spirit or scope of the invention. Thus, it is intended that the present invention cover the modifications and variations of this invention provided they come within the scope of the appended claims and their equivalents.

What is claimed is:

1. An etching method for forming a plurality of trenches or recesses having depths different from one another in a single crystalline silicon substrate, comprising the steps of:

forming an etching mask on the single crystalline silicon substrate;

forming a plurality of patterns in the etching mask corresponding to depths of the plurality of trenches, each of the plurality of patterns having different widths in a direction parallel to a surface of the single crystalline silicon substrate; and, etching the single crystalline silicon substrate using the etching mask having the plurality of patterns formed therein.

2. An etching method, comprising the steps of:

forming an etching mask on a substrate;

etching a first, a second, and a third region in the etching mask to a first depth at the same time;

forming a first mask pattern in the first region, and using the first mask pattern as a mask in etching the second and third regions of the etching mask at the same time to a second depth;

removing the first mask pattern, and forming second mask patterns in the first and second regions;

using the second mask patterns as masks in etching the third region of the etching mask using the second mask patterns as a mask, to expose the substrate;

removing the second mask patterns, and using the etching mask as a mask in etching the exposed substrate to a third depth;

etching the second region of the etching mask to expose the substrate, and etching the exposed substrate to a fourth depth using the etching mask; and etching the first region of the etching mask to expose the substrate, and using the etching mask as a mask in etching the exposed substrate to a fifth depth.

3. A method as claimed in claim 2, wherein the substrate is etched either by wet etching or dry etching.

4. A method as claimed in claim 3, wherein, in the wet etching, the etching mask is formed of SiN, and HNA(HF+HNO$_3$+Acetic Acid), EDP(Ethylenediamine Pyrocatechol Water), TMAH(Tetramethyl Ammonium Hydroxide), or KOH(Potassium Hydroxide) is used as an etching solution.

5. A method as claimed in claim 3, wherein, in the dry etching, the etching mask is formed of ITO(Indium Tin Oxide), and SF$_6$ is used an etching gas.

6. A method as claimed in claim 2, wherein the first and second mask patterns are formed of photoresist.

* * * * *